United States Patent
Pallotta

(12) 
(10) Patent No.: US 12,057,869 B2
(45) Date of Patent: Aug. 6, 2024

(54) APPARATUS AND METHOD FOR LINEARIZING A TRANSMISSION SIGNAL

(71) Applicant: STMicroelectronics S.r.l., Agrate Brianza (IT)

(72) Inventor: Andrea Pallotta, Rho (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 535 days.

(21) Appl. No.: 17/468,053

(22) Filed: Sep. 7, 2021

(65) Prior Publication Data

US 2022/0116062 A1 Apr. 14, 2022

(30) Foreign Application Priority Data

Oct. 9, 2020 (FR) ...................................... 2010321

(51) Int. Cl.
| | | |
|---|---|---|
| H04B 1/04 | (2006.01) | |
| H01Q 3/30 | (2006.01) | |
| H03F 1/32 | (2006.01) | |
| H04K 1/02 | (2006.01) | |
| H04L 27/34 | (2006.01) | |

(52) U.S. Cl.
CPC ............. *H04B 1/0475* (2013.01); *H01Q 3/30* (2013.01); *H04L 27/34* (2013.01); *H04B 2001/0425* (2013.01)

(58) Field of Classification Search
None
See application file for complete search history.

(56) References Cited

U.S. PATENT DOCUMENTS

| | | | | |
|---|---|---|---|---|
| 5,959,500 A | * | 9/1999 | Garrido ................. | H03F 1/3223 375/297 |
| 6,141,390 A | * | 10/2000 | Cova ..................... | H03F 1/3247 332/162 |
| 7,372,918 B2 | * | 5/2008 | Muller ................. | H04B 1/0475 375/296 |
| 7,469,491 B2 | * | 12/2008 | McCallister .......... | H03F 1/3247 375/269 |
| 7,583,754 B2 | | 9/2009 | Liu | |

(Continued)

FOREIGN PATENT DOCUMENTS

| | | |
|---|---|---|
| CN | 103731105 A | 4/2014 |
| CN | 105978500 A | 9/2016 |

(Continued)

OTHER PUBLICATIONS

Stapleton, Shawn P., et al., "An Adaptive Predistorter for a Power Amplifier Based on Adjacent Channel Emissions", IEEE Transactions on Vehicular Technology, vol. 41, No. 1, Feb. 1992, 8 pages.

(Continued)

*Primary Examiner* — Pablo N Tran
(74) *Attorney, Agent, or Firm* — Slater Matsil, LLP

(57) ABSTRACT

A embodiment method, for linearizing a transmission signal resulting from a quadrature amplitude modulation of an analog baseband signal and a radiofrequency amplification, comprises a demodulation of a feedback signal taken from the transmission signal, a comparison between the demodulated feedback signal and the baseband signal, a digital calculation of a predistortion control signal based on the comparison, and an analog predistortion of the analog baseband signal controlled by the predistortion control signal.

20 Claims, 2 Drawing Sheets

(56) References Cited

U.S. PATENT DOCUMENTS

| | | | |
|---|---|---|---|
| 11,418,155 B2* | 8/2022 | Kim | H03F 1/3247 |
| 2007/0253510 A1 | 11/2007 | Danz | |
| 2011/0064155 A1* | 3/2011 | Ashita | H04L 27/368 |
| | | | 375/260 |
| 2012/0147993 A1* | 6/2012 | Kim | H04W 24/04 |
| | | | 375/297 |
| 2014/0118066 A1* | 5/2014 | Lee | H03F 3/24 |
| | | | 330/149 |
| 2017/0359111 A1 | 12/2017 | Shaked | |
| 2020/0169276 A1 | 5/2020 | Kim et al. | |
| 2020/0266772 A1* | 8/2020 | Hosoda | H04B 1/0483 |
| 2021/0203282 A1 | 7/2021 | Van Liere et al. | |
| 2023/0327687 A1* | 10/2023 | Kishida | H04B 1/0458 |
| | | | 455/552.1 |

FOREIGN PATENT DOCUMENTS

| | | |
|---|---|---|
| CN | 106877825 A | 6/2017 |
| CN | 109150213 A | 1/2019 |
| CN | 111082756 A | 4/2020 |
| CN | 111226391 A | 6/2020 |
| DE | 19934215 C1 | 3/2001 |
| EP | 1662735 A1 | 5/2006 |
| FR | 3012704 A1 | 5/2015 |
| KR | 1019990043668 A | 6/1999 |

OTHER PUBLICATIONS

Ni Yangqin Zhang Tiedi Yan Bo, "K-band BiCMOS high efficiency power amplifier," University of Electronic Science and Technology of China, Chengdu, 611731, Proceedings of 2019 National Conference on Microwave and Millimeter Waves (NCMMW2019), May 19, 2019, 3 pages.

Pepe, D. et al., "1.29-W/mm2 23-dBm 66-GHz Power Amplifier in 55-nm SiGe BiCMOS With In-Line Coplanar Transformer Power Splitters and Combiner," IEEE Microwave and Wireless Components Letters, vol. 27, No. 12, Dec. 2017, 3 pages.

\* cited by examiner

APPARATUS AND METHOD FOR LINEARIZING A TRANSMISSION SIGNAL

CROSS-REFERENCE TO RELATED APPLICATIONS

This application claims the benefit of French Patent Application No. 2010321, filed on Oct. 9, 2020, which application is hereby incorporated herein by reference.

TECHNICAL FIELD

Embodiments relate generally to wireless communication, and in particular to linearization of a transmission signal resulting from a quadrature amplitude modulation and a radiofrequency amplification.

BACKGROUND

Electronic wireless communication devices such as transceivers typically incorporate a high spectral efficiency signal transmission device using a numerical quadrature amplitude modulation ("M-ary Quadrature Amplitude Modulation", M-QMA) to send signals.

The high spectral efficiency transmission device typically uses a linear modulation method for the transmission signal and includes quadrature modulation devices and radiofrequency amplifiers.

However, quadrature modulation devices and most radiofrequency amplifiers are non-linear electronic devices and introduce distortion on the transmission signals.

Therefore, signal linearization circuits, incorporated in the high spectral efficiency transmission device, are known to apply predistortion to the signal to be sent so as to compensate for the distortion introduced by radiofrequency amplifiers and quadrature modulation devices.

In addition, the non-linear characteristics of radiofrequency amplifiers can vary over time, for example due to the aging of the amplifiers themselves, temperature variations or power supply variations; there is therefore a need to provide adaptive linearization circuits.

Known adaptive linearization circuits are classically performed on the transmission radiofrequency or on an intermediate frequency and are efficient when the high spectral efficiency transmission device is incorporated into a wireless electronic communication device comprising a single transmission antenna.

Conversely, when an electronic communication device comprises a plurality of transmission chains, each including a quadrature modulation device and a non-linear radiofrequency amplifier, such as for instance an Active Phased Array Antenna System "APAAS" that can comprise dozens of transmission chains, the classical adaptive linearization circuits and methods present functional problems due to the fact that they should be locally provided for each transmission chain, i.e., each antenna segment.

Indeed, local solutions raise issues related to the area consumption, power consumption, and high design complexity of the integrated circuit (IC).

Consequently, these IC designs, for locally driving each antenna segment, are pushing process integration capabilities to their limits and are not cost-effective, in the context of multi-transmission chain devices, such as APAAS.

In addition, low energy and low-cost single-transmission chain devices can benefit from lower area consumption, lower power consumption, and lower design complexity.

Thus, there is a need to provide a linearization technique for a transmission chain with high spectral efficiency that can overcome the disadvantages of known techniques, while not reducing or degrading the performance characteristics, such as high transmission reach, high efficiency, low error rate, and low adjacent channel interference. The values of these performance characteristics can typically be imposed by standards.

SUMMARY

According to embodiments, a solution combining analog and digital adaptive predistortion is proposed for compact high spectral efficiency transmitters. The mixed-signal (analog and digital) adaptive predistortion is directly applied on I and Q analog baseband waveforms and can advantageously be based on the combined monitoring of the intermodulation out-of-band power and the integrated symbol error numeric signal obtained at sampling rate up to well below the Nyquist frequency.

According to an aspect, a method is proposed for linearizing a transmission signal resulting from a quadrature amplitude modulation of an analog baseband signal and a radiofrequency amplification, comprising a demodulation of a feedback signal taken from the transmission signal, a comparison between the demodulated feedback signal and the baseband signal, a digital calculation of a predistortion control signal based on the comparison, and an analog predistortion of the analog baseband signal controlled by the predistortion control signal.

Thus, since predistortion is applied on the low frequency of the analog baseband signal instead on an intermediate frequency signal or a radiofrequency signal, the digital calculation and the analog predistortion waveform design are less difficult and less critical, and the architecture can be simplified reducing power and area consumption.

According to an embodiment, the comparison is a digital comparison and the method comprises an analog to digital conversion of the demodulated feedback signal, and an analog to digital conversion of the baseband signal.

The analog to digital conversions are thus provided for the low frequency of the baseband signal, in a simpler architecture with lower energy consumption, in contrast to classical techniques performing high sampling rates, which are typically over twice the bandwidth of the baseband transmission signal (i.e., over the Nyquist frequency). Indeed, since the non-linear characteristics of radiofrequency amplifiers can vary slowly over time, for example due to the aging of the amplifiers themselves, ambient temperature changes, voltage supply variations or switching between transmission channels, the analog to digital conversions can be performed well below the Nyquist frequency of the baseband transmission signal.

According to an embodiment, the method comprises a symbol de-mapping of the digital demodulated feedback signal, a symbol de-mapping of the digital baseband signal, and the digital comparison comprises a comparison between the symbols of the feedback signal and the symbols of the baseband signal.

The symbols comparison provides awareness of the quality of the transmitted radiofrequency signal according to this less complex solution, and thus permits to reduce the error vector magnitude in the symbol constellation.

According to an embodiment, the digital calculation of the predistortion control signal is additionally based on an out-of-band power detection of the analog demodulated feedback signal.

The out-of-band power detection prevents spectral regrowth from causing interference in adjacent channels of the spectrum.

Accordingly, double checking both the out-of-band intermodulation power and the symbol error rate guarantees no impact of the predistortion method on the transmitted symbol integrity, while providing a third order intermodulation improvement of around 15 dB.

According to another aspect, a method is proposed for linearizing a plurality of transmission signals of an active phased array antenna system, comprising the method as defined above for each transmission signal.

Indeed, the high architecture simplification, the reduced power dissipation and area consumption, and the high performances provided by the method for linearizing each transmission signal, enables its implementation to be multiplied in a single device such as an active phased array antenna system.

According to another aspect, an integrated circuit comprising a transmission driver configured to perform a quadrature amplitude modulation and a radiofrequency amplification of an analog baseband signal are proposed. Further proposed is a linearization circuit comprising a demodulator circuit configured to demodulate a feedback signal taken from the transmission signal, a comparator circuit configured to compare the demodulated feedback signal with the baseband signal, a digital calculation unit configured to calculate a predistortion control signal based on a comparison result provided by the comparator circuit, and an analog predistorter circuit configured to predistort the analog baseband signal controlled by the predistortion control signal.

According to an embodiment, the comparator circuit is a digital comparator circuit and the integrated circuit comprises an analog to digital converter configured to convert the demodulated feedback signal and an analog to digital converter configured to convert the baseband signal.

According to an embodiment, the integrated circuit comprises a symbol de-mapper configured to de-map symbols of the digital demodulated feedback signal and a symbol de-mapper configured to de-map the symbols of the digital baseband signal. Furthermore, the digital comparator circuit is configured to compare the symbols of the demodulated feedback signal with the symbols of the baseband signal.

According to an embodiment, the integrated circuit additionally comprises an out-of-band power detector circuit configured to detect out-of-band intermodulation power of the analog demodulated feedback signal, and the digital calculation unit is configured to calculate the predistortion control signal additionally based on the out-of-band power detection result.

According to another aspect, an active phased array antenna system is proposed, the system comprising a plurality of transmission drivers and the integrated circuit as defined above for each transmission driver.

BRIEF DESCRIPTION OF THE DRAWINGS

Other advantages and features of the invention shall appear from an examination of the detailed description of non-limitative embodiments of the invention, and of the drawings annexed thereto in which.

DETAILED DESCRIPTION OF ILLUSTRATIVE EMBODIMENTS

Figure 1:
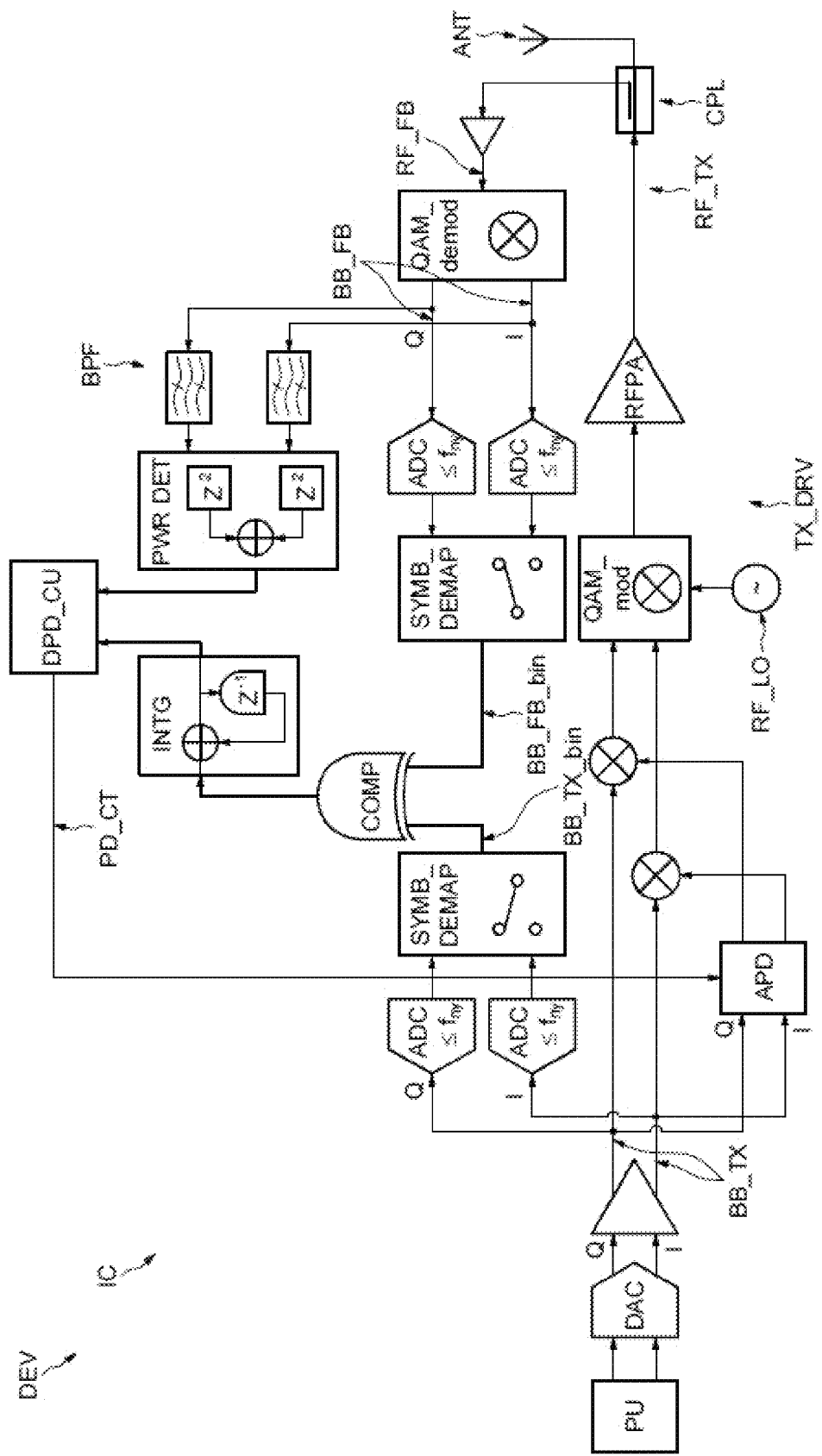
FIG. 1 illustrates a transmission device.

FIG. 1 illustrates an integrated circuit IC, in particular a transmission chain TX_DRV, also called transmission antenna driver, incorporated in a high spectral efficiency transmission device DEV. For example, the high spectral efficiency transmission device DEV can be a 5G backhaul transceiver, or the like.

A processing unit PU generates a digital baseband signal conveying data in a numerical quadrature amplitude modulation ("M-ary Quadrature Amplitude Modulation", "M-QMA"), on both the in-phase channel I and the quadrature-phase channel Q. Such M-QAM data are binary words of $\log_2(M)$ bits coded according to a constellation of symbols identified in the complex-plane by the phase and the amplitude of the signal.

A digital to analog converter DAC provides (in addition with an I/Q driver) the analog baseband signal BB_TX converted from the digital output of the processing unit PU.

The processing unit PU, the digital to analog converter DAC and the I/Q driver are generally external to the high spectral efficiency transmission device DEV, and belong typically to a digital baseband board.

The transmission antenna driver TX_DRV comprises a mixer QAM_mod configured to perform a quadrature amplitude modulation on the baseband transmission signal BB_TX, outputting a radiofrequency-modulated signal RF_TX. A local oscillator RF_LO or another source provides the radiofrequency carrier signal to the mixer QAM_mod.

The term "radiofrequency" is understood to denote the frequency of the carrier signal depending on the application of the transmission device, and can be used to qualify the ability of an element to operate at these frequencies. For example, the carrier signal radiofrequency can be above 24 GHz in possible 5G applications ("5G NR" or "LTE" standards), or for example 2.4 GHz or 5 GHz in possible WiFi applications ("ISO 802.11" standard).

The driver TX_DRV includes a radiofrequency amplifier RFPA configured to perform a power amplification of the radiofrequency-modulated signal output from the mixer QAM_mod.

The amplifier RFPA operates with a very small back-off power with respect to its saturation point in order to enable high transmission reach and efficiency. For instance, the amplifier RFPA operates close to 90% saturation. The amplifier RFPA operates at this type of level with a non-linear power input to power output characteristic, which causes distortion on the radiofrequency transmission signal RF_TX at the antenna ANT.

Thus, the integrated circuit includes a linearization circuit for linearizing the transmitter chain TX_DRV of the high spectral efficiency wireless transmission device, by applying predistortion on the transmission signal amplified by the amplifier RFPA in order to compensate for the amplifier's RFPA non-linear characteristics.

The linearization circuit comprises a feedback loop circuit, retrieving the radiofrequency transmission signal RF_TX through a coupler CPL, for instance an inductive coupler. The coupler CPL provides a radiofrequency feedback signal RF_FB, equaling the radiofrequency transmission signal RF_TX, to the feedback loop. In the illustrated example, the coupler CPL may include a feedback signal amplifier.

For calculating the predistortion to apply to the waveform, the linearization circuit thus uses the feedback signal, which is based on the actual transmission signal RF_TX at the output of the transmission chain TX_DRV. Accordingly, the predistortion takes into account the variation over time of the transmission chain TX_DRV, such as the aging of the amplifier RFPA, temperature variations or power supply variation.

The linearization circuit comprises a demodulator circuit QAM_demod configured to demodulate the feedback signal RF_FB, providing an analog baseband (demodulated) feedback signal BB_FB on feedback channels I and Q.

Advantageously, as it will be discussed later, these feedback channels I and Q can be input to an out-of-band power detector circuit PWR_DET. In the illustrated example, the inputs pass through bandpass pre-filters BPF. The out-of-band power detector circuit PWR_DET is configured to detect out-of-band intermodulation power of the analog demodulated feedback signal BB_FB.

The analog demodulated feedback signal BB_FB is converted to a digital baseband feedback signal through analog to digital converters ADC on the feedback channels I and Q.

Simultaneously, the "root" analog baseband transmission signal BB_TX is converted to a digital baseband transmission signal through analog to digital converters ADC connected to the transmission channels I and Q.

It is highlighted here that the analog to digital converters ADC are designed for the low frequencies of the baseband signals BB_TX, BB_FB, and thus the sampling rates they perform are defined according to those low frequencies. Additionally, as it will appear later, the analog to digital converters ADC are designed at sampling rates that can be well below (that is to say, below half of) the Nyquist sampling frequency.

Accordingly, in practice, the analog to digital converters ADC of the present embodiment are greatly simplified and much more compact and energy-efficient than the typically used converters with higher sampling rate.

The digitally-converted baseband feedback signal and the digitally-converted baseband transmission signal are de-mapped through respective symbol de-mapper circuits SYMP_DEMAP. The symbol de-mapper circuits SYMP_DEMAP are accordingly configured to de-map symbols of the digital demodulated feedback signal symbols of the digital baseband signal.

De-mapping symbols of a signal signifies converting the phase and amplitude of the signal to a corresponding binary-coded value according to a reference map of the symbols in the complex-plane.

The obtained binary values BB_FB_bin corresponding to the symbols of the digital demodulated feedback signal, and the obtained binary values BB_TX_bin corresponding to the symbols of the digitally-converted baseband transmission signal, are compared by a digital comparator circuit COMP. The result of this comparison provides a symbol error rate of the transmission signal RF_TX.

Advantageously for digital control matter, the symbol error rate instant value is provided to an integrator circuit INTG configured to integrate the symbol error rate before providing it to the calculation unit DPD_CU. The digital integrator INTG brings the digital error signal to zero.

In the feedback loop, the digital comparator circuit COMP, accordingly configured to compare the demodulated feedback signal RF_BB with the baseband transmission signal BB_TX, provides the basis for the calculation of the predistortion compensating non-linearities of the transmission chain TX_DRV.

A digital calculation unit DPD_CU is configured to calculate a predistortion control signal PD_CT based on the symbol error rate provided by the comparator circuit COMP.

In the illustrated example, the result of the out-of-band power detector circuit PWR_DET is additionally used by the digital calculation unit DPD_CU to calculate the predistortion control signal PD_CT.

The digital predistortion control signal PD_CT controls an analog predistorter circuit APD.

The analog predistorter circuit APD is configured to predistort the analog baseband signal BB_TX in the transmission chain TX_DRV, i.e., to design the waveform of the analog baseband signal BB_TX inversely to the distortion the signal will endure through the non-linear elements in the transmission chain TX_DRV (mostly the amplifier RFPA).

For instance, the predistortion control signal contains digital values of parameters, such as coefficients of third-degree or fifth-degree polynomial solutions for minimizing the symbol error rate (and for minimizing the out-of-band intermodulation power).

The analog predistorter circuit APD is configured to convert the digital parameters values to analog tuning signals. The analog tuning signals are combined with the analog baseband transmission signal BB_TX, for instance through mixer elements, in order to tune (or design) the waveform of the transmission signal BB_TX.

Thus, turning now to the sampling frequency of the analog to digital converters ADC, since the digitally-converted signals are used for symbol comparison in order to adaptively adjust the predistortion control signal PD_CT, the digital-converted signals do not need to contain precisely the entire information conveyed in the initial analog signals BB_TX, BB_FB. Consequently, the sampling rates of the analog to digital converters ADC can be set well below the Nyquist sampling frequency.

In other words, the depicted linearization circuit designs the waveform of the analog baseband transmission signal BB_TX; it makes a digital comparison between the transmitted symbols and the received feedback symbols. The digital predistortion device then calculates the predistortion coefficients both on the basis of the out-of-band signal part and on the integration of the symbol error rate.

Since predistortion is applied on the low frequency analog baseband, the waveform design is less difficult and less critical to process by the calculation unit DPD_CU and to apply by the analog predistorter circuit APD, in comparison with typical waveform designs performed on the radiofrequency domain.

Furthermore, making the predistortion directly on the analog signal and processing the feedback in the digital domain, prevents (in comparison to fully-digital operation on the radiofrequency domain): bringing back the analog baseband to digital with a high end complex, power and area consuming analog to digital converter, making the predistortion digitally with a power and area consuming digital signal processor, and then returning to the analog domain by a high end complex, power and area consuming digital to analog converter.

In other words, making the predistortion directly on the analog baseband signal and processing the feedback in the digital domain, greatly simplifies the architecture and reduces power and silicon area.

Additionally, double checking both the out-of-band intermodulation power and the symbol error rate, guarantees no impact of the predistortion process on the transmitted symbol integrity, while providing a 3rd order intermodulated frequency improvement of around 15 dB.

The high architecture simplification and the reduction in power dissipation and area consumption, enables to put into practice a high spectral efficiency transmission device DEV in medium density digital gate integration with analog component in a single chip.

Technologies combining digital and analog on a single chip, often called "BiCMOS" technology (referring to Bipolar-gate technologies and Complementary Metal Oxide Semiconductor-gate technologies), are typically faced with trade-off on both analog part and digital parts resulting from manufacturing method co-integration.

Accordingly, the channel length of the digital gates can be limited to 55 nm for example, which corresponds to "medium density". These BiCMOS technologies are thus typically unfavorable for implementing the classical linearization techniques, which use high-performance digital signal processing "DSP" units, high sampling frequency analog to digital converters and high sampling frequency digital to analog converters.

In other words, the classical full-digital linearization techniques are not practical for co-integrated digital and analog components technologies, while the combination of analog and digital linearization circuits affecting the analog baseband waveform, as described in relation with FIG. 1, provide a solution for implementing a high spectral efficiency transmission device DEV in medium density digital and analog co-integrated ("BiCMOS") single chips.

In addition, the provided solution permits low energy and low-cost application systems to incorporate such a high spectral efficiency transmission device DEV having a single-transmission chain.

For example, a wireless video recording drone device for general consumer use can benefit from such an energy-efficient linearization chain, allowing for instance real-time broadcasting of a high-definition video signal.

Also, these advantages enable to put into practice a plurality of linearization circuits in a single integrated circuit, for linearizing a large number of transmitter chains TX_DRV, for instance in a high spectral efficiency wireless transmission device including an active phased array antenna system.

Figure 2:
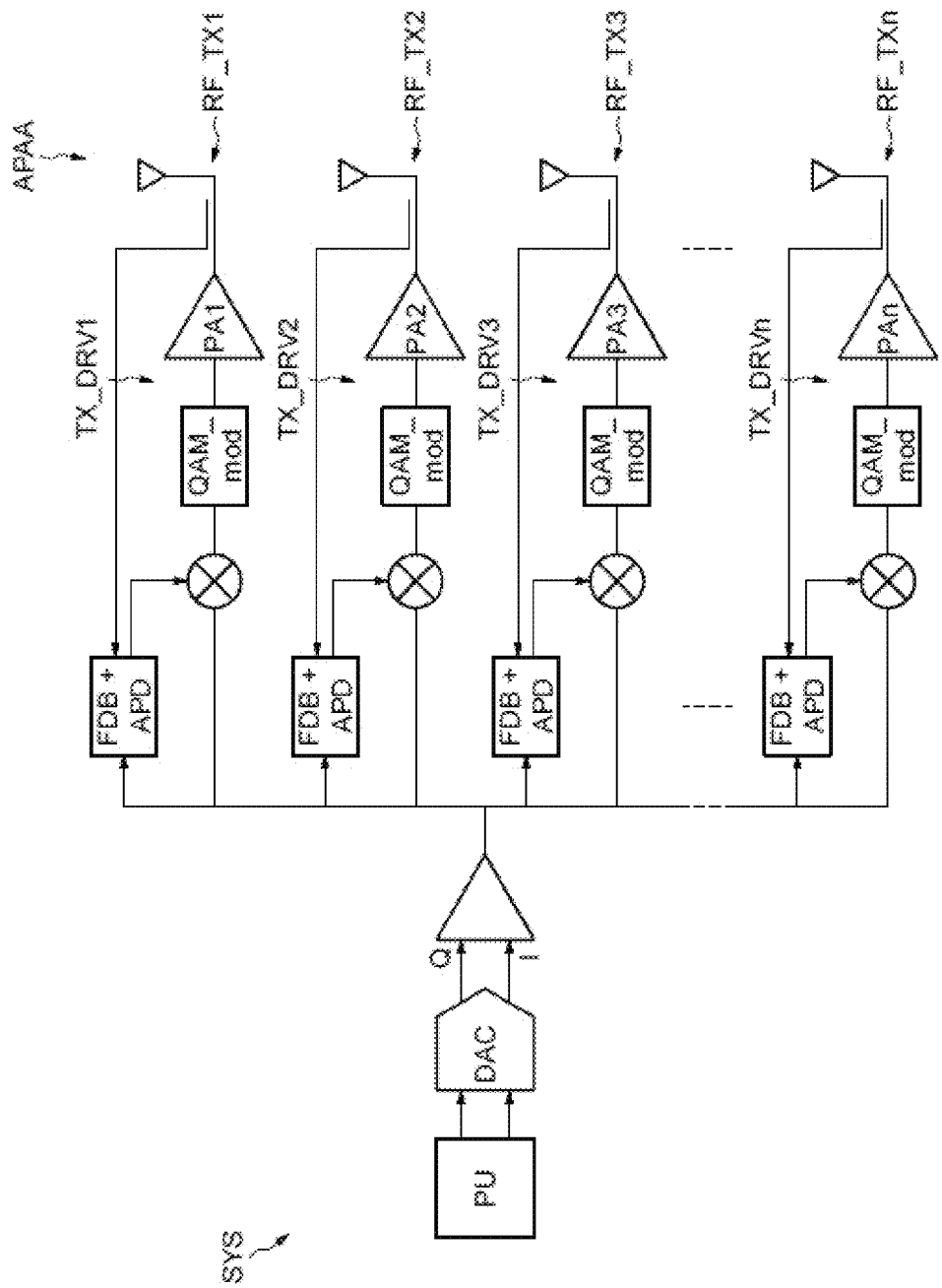
FIG. 2 illustrates an active phased array antenna system.

Reference is made to FIG. 2.

FIG. 2 illustrates an active phased array antenna system SYS, comprising an array of antennas APAA.

The antennas APAA are intended to emit the same transmission signal, with however an individual phase shifting (not illustrated) in order to superpose the individual spherical wavefronts to create a plane wave beam travelling in a specifically oriented direction.

Each antenna is driven by a respective transmission chain TX_DRV1, TX_DRV2, TX_DRV3, . . . , TX_DRVn that can number for instance in the dozens.

The transmission chains TX_DRV1-TX_DRVn are each of the same type as the transmission chain TX_DRV described hereinabove in relation with FIG. 1, and each includes in particular a quadrature amplitude modulator QAM_mod and a radiofrequency amplifier PA1-PAn.

Classical adaptive linearization techniques are complex and expensive to implement in such antenna arrays, since they need to provide for each and every transmission chain TX_DRV1-TX_DRVn some high-performance digital signal processing "DSP" units, high sampling frequency analog to digital converters and high sampling frequency digital to analog converters.

Consequently, the currently used classical linearization techniques in such antenna arrays are performed upstream at the digital processing unit PU, generating a predistorted digital baseband signal for just one transmission chain TX_DRV. This classical digital linearization method becomes proportionally inefficient as the number of transmission chain increases as in the APAA systems.

As mentioned earlier, thanks to the simple architecture, the low power dissipation and the low area consumption of the linearization circuit described hereinabove in relation with FIG. 1, each transmission chain TX_DRV1-TX_DRVn of the active phased array antenna system SYS is provided with its individual linearization circuit, namely the digital feedback loop FDB and the analog predistorter APD as these were described in relation to FIG. 1.

Thus, the specific distortion on each transmission signal RF_TX1-RF_TXn, respectively caused by the nonlinearity of the of radiofrequency amplifiers PA1, PA2, PA3, . . . , PAn, is adaptively compensated by the respective linearization circuit FDB, APD provided for each transmission chain TX_DRV1-TX_DRVn.

In addition, since the linearization circuit FDB, APD uses the feedback mechanism based on the actual transmission signal RF_TX1-RF_TXn at the output of the transmission chain TX_DRV1-TX_DRVn, as described in relation with FIG. 1, the predistortion is adaptive to variation over time of the transmission chain TX_DRV1-TX_DRVn, such as the aging of the amplifier PA1-PAn, temperature variations or power supply variation.

The lifespan and reliability of the system SYS is accordingly improved.

Various embodiments and variants have been described. Those skilled in the art will understand that certain features of these various embodiments and variants may be combined, and other variants will occur to those skilled in the art.

Finally, the practical implementation of the described embodiments and variations is within the abilities of those skilled in the art based on the functional indications given hereinabove.

What is claimed is:

1. A method for linearizing a transmission signal resulting from a quadrature amplitude modulation of an analog baseband signal and a radiofrequency amplification, the method comprising:
   analog demodulating a feedback signal taken from the transmission signal;
   comparing the demodulated feedback signal and the baseband signal;
   digitally calculating a predistortion control signal based on the comparing; and
   predistorting the analog baseband signal based on the predistortion control signal.

2. The method according to claim 1, wherein the comparing is a digital comparing, and the method further comprises:
   performing an analog to digital conversion of the demodulated feedback signal; and
   performing an analog to digital conversion of the baseband signal.

3. The method according to claim 2, wherein the method further comprises:
   de-mapping the digital demodulated feedback signal into feedback signal symbols; and
   de-mapping the digital baseband signal into baseband symbols;
   the digital comparing comprising comparing the feedback signal symbols and the baseband signal symbols.

4. The method according to claim 2, wherein each analog to digital conversion comprises a sampling frequency of below half a Nyquist sampling frequency of the respective signal.

5. The method according to claim 1, wherein the digitally calculating the predistortion control signal is additionally based on an out-of-band power detection of the analog demodulated feedback signal.

6. An active phased array antenna method for linearizing a plurality of transmission signals resulting from a quadrature amplitude modulation of an analog baseband signal and a radiofrequency amplification, the method comprising, for each transmission signal:
analog demodulating a feedback signal taken from the transmission signal;
comparing the demodulated feedback signal and the baseband signal;
digitally calculating a predistortion control signal based on the comparing; and
predistorting the analog baseband signal based on the predistortion control signal.

7. The method according to claim 6, wherein the comparing is a digital comparing, and the method further comprises:
performing an analog to digital conversion of the demodulated feedback signal; and
performing an analog to digital conversion of the baseband signal.

8. The method according to claim 7, wherein the method further comprises:
de-mapping the digital demodulated feedback signal into feedback signal symbols; and
de-mapping the digital baseband signal into baseband symbols;
the digital comparing comprising comparing the feedback signal symbols and the baseband signal symbols.

9. The method according to claim 7, wherein each analog to digital conversion comprises a sampling frequency of below half a Nyquist sampling frequency of the respective signal.

10. The method according to claim 6, wherein the digitally calculating the predistortion control signal is additionally based on an out-of-band power detection of the analog demodulated feedback signal.

11. An integrated circuit comprising:
a transmission antenna driver configured to perform a quadrature amplitude modulation and a radiofrequency amplification of an analog baseband signal; and
a linearization circuit comprising:
an analog demodulator circuit configured to demodulate a feedback signal taken from an output transmission signal;
a comparator circuit configured to compare the demodulated feedback signal with the baseband signal;
a digital calculation unit configured to calculate a predistortion control signal based on a comparison result provided by the comparator circuit; and
an analog predistorter circuit configured to predistort the analog baseband signal controlled by the predistortion control signal.

12. The integrated circuit according to claim 11, wherein the comparator circuit is a digital comparator circuit; and the integrated circuit comprises:
a first analog to digital converter configured to convert the demodulated feedback signal; and
a second analog to digital converter configured to convert the baseband signal.

13. The integrated circuit according to claim 12, wherein the integrated circuit further comprises:
a first symbol de-mapper circuit configured to de-map symbols of the digital demodulated feedback signal; and
a second symbol de-mapper circuit configured to de-map symbols of the digital baseband signal;
wherein the digital comparator circuit is configured to compare the symbols of the feedback signal with the symbols of the baseband signal.

14. The integrated circuit according to claim 12, wherein each analog to digital converter operates at a sampling frequency of below half a Nyquist sampling frequency of the respective signal.

15. The integrated circuit according to claim 11, further comprising:
an out-of-band power detector circuit configured to detect out-of-band intermodulation power of the analog demodulated feedback signal;
wherein the digital calculation unit is configured to calculate the predistortion control signal based additionally on an out-of-band power detection result.

16. An active phased array antenna system, comprising:
a plurality of transmission antenna drivers, each configured to perform a quadrature amplitude modulation and a radiofrequency amplification of an analog baseband signal; and
an integrated circuit comprising, for each transmission antenna driver:
an analog demodulator circuit configured to demodulate a feedback signal taken from an output transmission signal;
a comparator circuit configured to compare the demodulated feedback signal with the baseband signal;
a digital calculation unit configured to calculate a predistortion control signal based on a comparison result provided by the comparator circuit; and
an analog predistorter circuit configured to predistort the analog baseband signal controlled by the predistortion control signal.

17. The active phased array antenna system according to claim 16,
wherein the comparator circuit is a digital comparator circuit; and
wherein the integrated circuit comprises:
a first analog to digital converter configured to convert the demodulated feedback signal; and
a second analog to digital converter configured to convert the baseband signal.

18. The active phased array antenna system according to claim 17, wherein the integrated circuit further comprises:
a first symbol de-mapper circuit configured to de-map symbols of the digital demodulated feedback signal; and
a second symbol de-mapper circuit configured to de-map symbols of the digital baseband signal;
wherein the digital comparator circuit is configured to compare the symbols of the feedback signal with the symbols of the baseband signal.

19. The active phased array antenna system according to claim 17, wherein each analog to digital converter operates at a sampling frequency of below half a Nyquist sampling frequency of the respective signal.

20. The active phased array antenna system according to claim 16, further comprising:
an out-of-band power detector circuit configured to detect out-of-band intermodulation power of the analog demodulated feedback signal;

wherein the digital calculation unit is configured to calculate the predistortion control signal based additionally on an out-of-band power detection result.

* * * * *